United States Patent
Buchberger, Jr. et al.

(10) Patent No.: US 7,649,729 B2
(45) Date of Patent: Jan. 19, 2010

(54) ELECTROSTATIC CHUCK ASSEMBLY

(75) Inventors: Douglas A. Buchberger, Jr., Livermore, CA (US); Paul Brillhart, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 57 days.

(21) Appl. No.: 11/871,807

(22) Filed: Oct. 12, 2007

(65) Prior Publication Data

US 2009/0097184 A1    Apr. 16, 2009

(51) Int. Cl.
   *H02N 13/00* (2006.01)
(52) U.S. Cl. .......................................... 361/234
(58) Field of Classification Search ................. 361/234
   See application file for complete search history.

(56) References Cited

U.S. PATENT DOCUMENTS

| | | | |
|---|---|---|---|
| 4,628,991 A | 12/1986 | Hsiao et al. | |
| 5,155,652 A | 10/1992 | Logan et al. | |
| 5,423,945 A | 6/1995 | Marks et al. | |
| 5,583,736 A * | 12/1996 | Anderson et al. | 361/234 |
| 5,675,471 A * | 10/1997 | Kotecki | 361/234 |
| 5,754,391 A | 5/1998 | Bates | |
| 5,761,023 A | 6/1998 | Lue et al. | |
| 5,883,778 A | 3/1999 | Sherstinsky et al. | |
| 5,892,207 A | 4/1999 | Kawamura et al. | |
| 6,015,761 A | 1/2000 | Merry et al. | |
| 6,079,356 A | 6/2000 | Umotoy et al. | |
| 6,107,608 A | 8/2000 | Hayes | |
| 6,108,189 A | 8/2000 | Weldon et al. | |
| 6,310,755 B1 | 10/2001 | Kholodenko et al. | |
| 6,320,736 B1 | 11/2001 | Shamouilian et al. | |
| 6,357,143 B2 | 3/2002 | Morad et al. | |
| 6,440,221 B2 | 8/2002 | Shamouilian et al. | |
| 6,466,426 B1 | 10/2002 | Mok et al. | |
| 6,489,248 B2 | 12/2002 | Zang et al. | |
| 6,499,533 B2 | 12/2002 | Yamada | |
| 6,518,548 B2 | 2/2003 | Sugaya et al. | |
| 6,740,853 B1 * | 5/2004 | Johnson et al. | 219/444.1 |
| 6,786,982 B2 | 9/2004 | Lee et al. | |
| 6,853,067 B1 | 2/2005 | Cohn et al. | |
| 6,902,934 B1 | 6/2005 | Bergh et al. | |
| 7,221,553 B2 | 5/2007 | Nguyen et al. | |

(Continued)

OTHER PUBLICATIONS

PCT International Search Report and Written Opinion for International Application No. PCT/US08/79357 dated Jan. 30, 2009.

(Continued)

*Primary Examiner*—Ronald W Leja
(74) *Attorney, Agent, or Firm*—Patterson & Sheridan, LLP

(57) ABSTRACT

The present invention generally comprises an electrostatic chuck base, an electrostatic chuck assembly, and a puck for the electrostatic chuck assembly. Precisely etching a substrate within a plasma chamber may be a challenge because the plasma within the chamber may cause the temperature across the substrate to be non-uniform. A temperature gradient may exist across the substrate such that the edge of the substrate is at a different temperature compared to the center of the substrate. When the temperature of the substrate is not uniform, features may not be uniformly etched into the various layers of the structure disposed above the substrate. A dual zone electrostatic chuck assembly may compensate for temperature gradients across a substrate surface.

19 Claims, 4 Drawing Sheets

U.S. PATENT DOCUMENTS

| | | |
|---|---|---|
| 7,436,645 B2 * | 10/2008 | Holland et al. ............... 361/234 |
| 2002/0076939 A1 | 6/2002 | Li et al. |
| 2003/0159307 A1 | 8/2003 | Sago et al. |
| 2003/0228772 A1 | 12/2003 | Cowans |
| 2004/0040664 A1 * | 3/2004 | Yang et al. ............. 156/345.51 |
| 2004/0115947 A1 | 6/2004 | Fink et al. |
| 2004/0212947 A1 * | 10/2004 | Nguyen et al. ............... 361/234 |
| 2005/0003675 A1 * | 1/2005 | Carducci et al. ............ 438/710 |
| 2005/0045106 A1 | 3/2005 | Boyd et al. |
| 2006/0076108 A1 | 4/2006 | Holland et al. |
| 2006/0076109 A1 | 4/2006 | Holland et al. |
| 2007/0042603 A1 | 2/2007 | Kropewnicki et al. |
| 2007/0075457 A1 | 4/2007 | Eichlseder |
| 2007/0102118 A1 | 5/2007 | Holland et al. |
| 2007/0139856 A1 | 6/2007 | Holland et al. |
| 2007/0258186 A1 * | 11/2007 | Matyushkin et al. ........ 361/234 |
| 2007/0274020 A1 * | 11/2007 | Park et al. ................... 361/234 |

OTHER PUBLICATIONS

"Duocel Aluminum Foam," ERG Materials and Aerospace Corporation. Oakland, CA, http://www.ergaerospace.com/duocel/aluminum.htm, no date.

* cited by examiner

ELECTROSTATIC CHUCK ASSEMBLY

BACKGROUND OF THE INVENTION

1. Field of the Invention

Embodiments of the present invention generally relate to an electrostatic chuck assembly for use in an etching chamber.

2. Description of the Related Art

In the manufacture of integrated circuits, precise control of various process parameters is necessary for achieving consistent results within a substrate, as well as the results that are reproducible from substrate to substrate. During processing, changes in the temperature and temperature gradients across the substrate may be detrimental to material deposition, etch rate, step coverage, feature taper angles, and other parameters of semiconductor devices.

In some processing applications, a substrate is retained to a substrate pedestal by an electrostatic chuck during processing. The electrostatic chuck is coupled to a base of the pedestal by clamps, adhesive, or fasteners. The chuck may be provided with an embedded electric heater, as well as be fluidly coupled to a source of backside heat transfer gas for controlling substrate temperature during processing. However, conventional substrate pedestals have insufficient means for controlling substrate temperature distribution across the diameter of the substrate. The inability to control substrate temperature uniformity has an adverse effect on process uniformity both within a single substrate and between substrates, device yield and overall quality of processed substrates.

Therefore, there is a need in the art for an improved electrostatic chuck assembly.

SUMMARY OF THE INVENTION

The present invention generally comprises an electrostatic chuck base, an electrostatic chuck assembly, and a puck for the electrostatic chuck assembly. In one embodiment, an electrostatic chuck base comprises an electrostatic chuck base body having one or more cooling channels formed within the body and a plurality of grooves formed in at least one of the one or more cooling channels.

In another embodiment, a puck for an electrostatic chuck assembly comprises a puck body and a plurality of mesas arranged across the puck body in at least two different patterns.

In another embodiment, an electrostatic chuck assembly comprises a puck, the puck comprising a puck body and a plurality of mesas arranged across the puck body in at least two different patterns and an electrostatic chuck base having an electrostatic chuck base body having one or more cooling channels formed within the body and a plurality of grooves formed in at least one of the one or more cooling channels.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises an electrostatic chuck base, an electrostatic chuck assembly, and a puck for the electrostatic chuck assembly. Precisely etching a substrate within a plasma chamber may be a challenge because the plasma within the chamber may cause the temperature across the substrate to be non-uniform. A temperature gradient may exist across the substrate such that the edge of the substrate is at a different temperature compared to the center of the substrate. When the temperature of the substrate is not uniform, features may not be uniformly etched into the various layers of the structure disposed above the substrate. A dual zone electrostatic chuck assembly may compensate for temperature gradients across a substrate surface.

The invention will be described below in relation to an etching chamber. However, a variety of plasma deposition and etching chambers may benefit from the teachings disclosed herein, and in particular, dielectric etching chambers such as the ENABLER® etch chamber, which may be part of a semiconductor wafer processing system such as the CENTURA® system, the PRODUCER® etch chamber, the eMax® etch chamber, among others, all of which are available from Applied Materials, Inc. of Santa Clara, Calif. It is contemplated that other plasma reactors, including those from other manufacturers, may be adapted to benefit from the invention.

Figure 1:
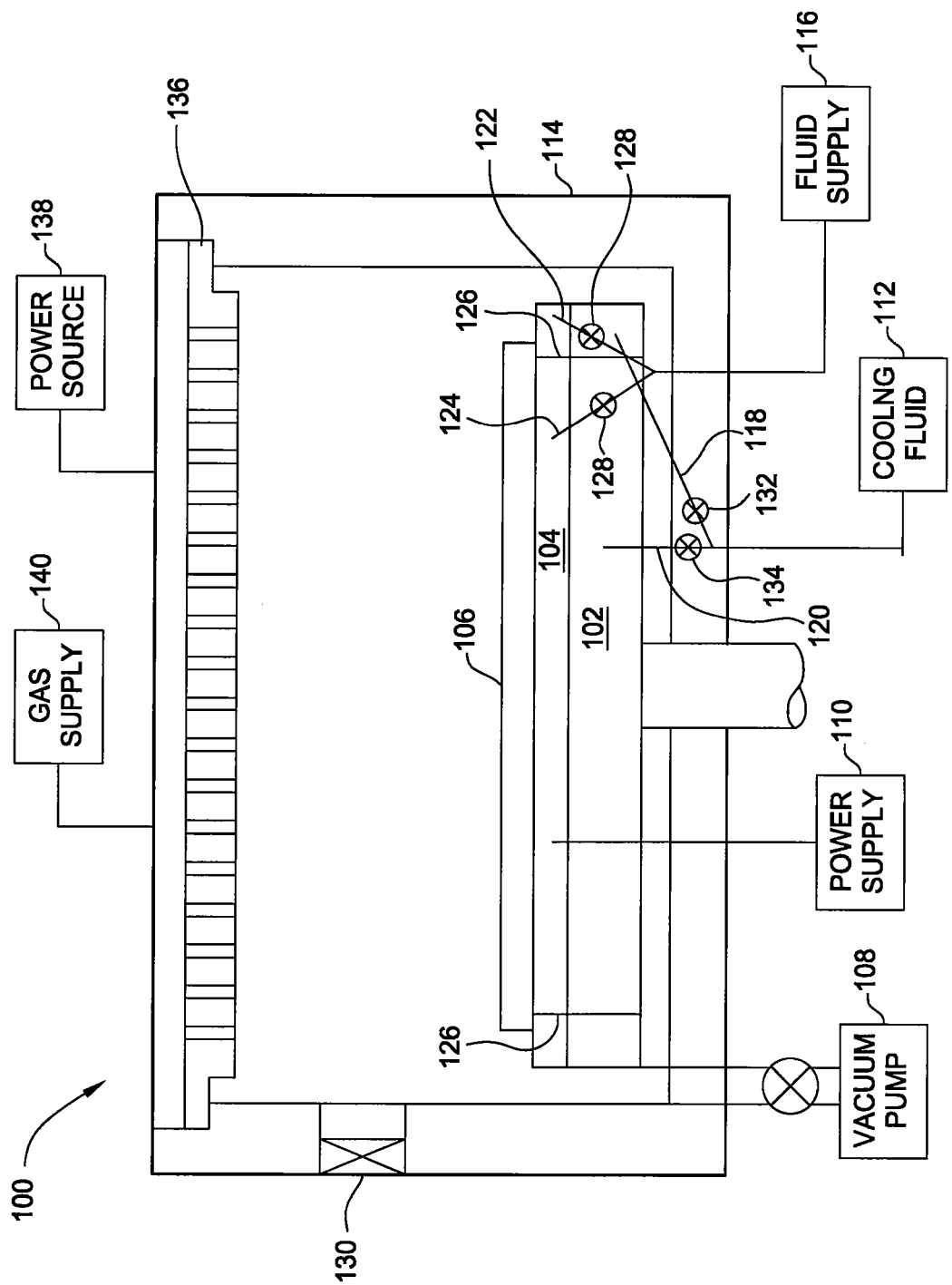
FIG. 1 is a schematic cross sectional view of a processing apparatus 100 according to one embodiment of the invention.

FIG. 1 is a schematic cross sectional view of a processing apparatus 100 according to one embodiment of the invention. The apparatus 100 is an etching apparatus 100 having an electrostatic chuck assembly. Etching gas from a gas supply 140 may be introduced through a showerhead 136 to the chamber. A power source 138 may bias the showerhead 136 to ignite and/or maintain a plasma in the chamber. The electrostatic chuck assembly comprises a base portion 102 and a puck 104 coupled with the base portion 102. In one embodiment, the puck 104 may be coupled with the base portion 102 by bonding. A substrate 106 may be disposed on the puck 104 for processing. The substrate 106 may be disposed into the processing chamber through a slit valve 130 that is disposed within a wall 114 of the processing chamber. The puck 104 may comprise at least one of aluminum oxide, aluminum nitride, silicon oxide, silicon carbide, silicon nitride, titanium oxide, zirconium oxide, and mixtures thereof. The puck 104 may be unitary monolith of ceramic made by hot pressing and sintering a ceramic powder, and then machining the sintered form to form the final shape of the puck 104. In one embodiment, the puck 104 may be etched to form the final shape of the puck 104.

A vacuum pump 108 may be used to evacuate the processing chamber to the desired pressure. The base portion 102 may be biased by a power supply 110. In one embodiment, the power supply 110 may be an RF power supply. In one embodiment, a plurality of power supplies 110 may be coupled with the base portion 102. A cooling fluid may be supplied to the base 102 of the electrostatic chuck assembly. In one embodiment, the cooling fluid may comprise water. In another embodiment, the cooling fluid may comprise a glycol. The cooling fluid may be supplied to two different areas or zones of the base 102 through two lines 118, 120. Valves 132, 134 may be metered to control the flow of the cooling fluid to the two zones of the base 102. In one embodiment, each zone has a separate fluid supply 112. The valves 132, 134 may be opened and closed by a controller (not shown). Additionally, the controller may control the amount of cooling fluid that flows to the inner and outer zones by controlling the amount that the valves 132, 134 are opened. An inner and an outer heating coil may be present to heat the inner and outer heating zones.

Inner and outer cooling zones in the base 102 of the electrostatic chuck assembly permit independent control of the temperatures of the inner and outer zones, to achieve different processing rates or characteristics across the radial direction of the substrate 106. As such, different temperatures may be maintained in the inner and outer zones of the base 102 to affect the temperatures of the overlying central and peripheral portions of the substrate 106, thereby counteracting any variable gas species distribution or heat load occurring during processing of the substrate 106. For example, when gas species at the peripheral portion of the substrate 106 are less active than those at the central portion, the temperature of the inner zone may be reduced to provide more uniform processing rates or process characteristics across the substrate 106.

Additional temperature control of the substrate 106 may occur due to introducing a heat transfer fluid between the puck 104 and the substrate 106. In one embodiment, the heat transfer fluid may comprise a gas. In another embodiment, the heat transfer fluid may comprise helium. The helium may be introduced from a fluid supply 116 to both the inner and the outer zones through lines 122, 124. Valves 128 may be opened and closed along the lines 122, 124 to permit the introduction of the helium to the backside of the substrate 106. The valves 128 may be controlled by a controller that opens and closes the valves 128. Additionally, the controller may control the amount that the valves 128 are open to control the amount of gas introduced to the backside of the substrate 106. A break 126 may be present between the inner and outer zones to define the boundary between the inner and outer zone. The break 126 may reduce the amount of heat transfer gas that passes between the inner and outer zones. The heat transfer gas may be chosen to regulate the heat transfer rate between the puck 104 and the substrate 106.

Figure 2:
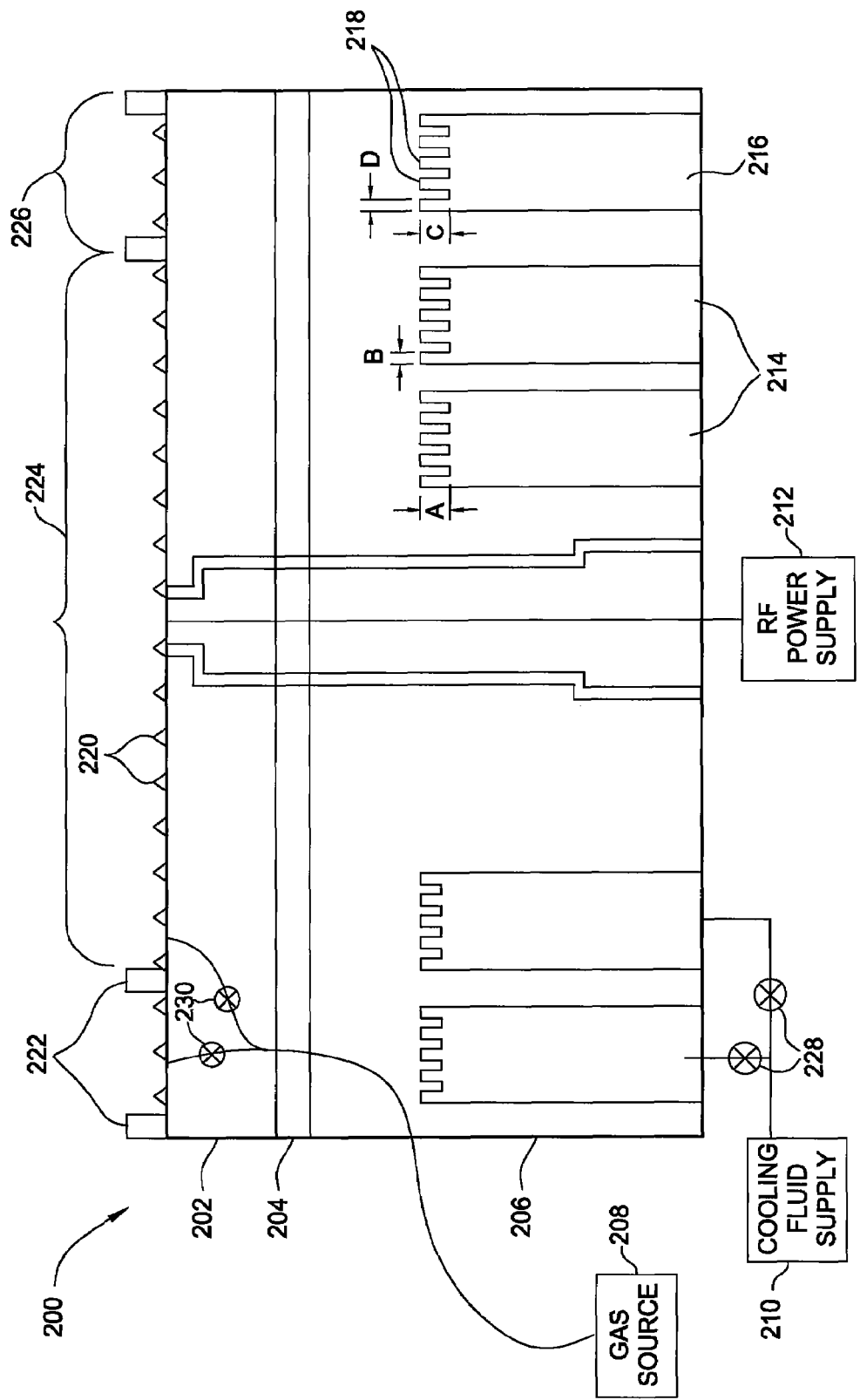
FIG. 2 is a schematic cross sectional view of an electrostatic chuck assembly 200 according to one embodiment of the invention.

FIG. 2 is a schematic cross sectional view of an electrostatic chuck assembly 200 according to one embodiment of the invention. The assembly 200 includes a puck 202 bonded to a base 206 by a bonding layer 204. The bonding layer 204 facilitates thermal coupling (i.e., heat exchange) between the puck 202 and the base 206. In one exemplary embodiment, the bonding layer 204 is an adhesive layer that mechanically bonds the puck 202 to the base 206. Alternatively (not shown), the assembly 200 may include a hardware (e.g., clamps, screws, and the like) adapted for fastening the puck 202 to the base 206. The temperature of the puck 202 and the base 206 may be monitored using a plurality of sensors (not shown), such as, thermocouples and the like, that are coupled to a temperature monitor. The assembly 200 may be biased by an RF power supply 212.

The assembly 200 may be divided into an inner zone 224 and an outer zone 226. Inner cooling channels 214 may be present within the inner zone 224 of the base 206. Outer cooling channels 216 may be present within the outer zone 226 of the base 206. Cooling fluid may be supplied to the channels 214, 216 from a cooling fluid supply 210. The amount of cooling fluid supplied to the channels 214, 216 may be controlled by valves 228. In one embodiment, a separate cooling fluid supply 210 may be present for the inner cooling channels 214 and the outer cooling channels 216.

Both the inner and outer cooling channels 214, 216 may have one or more grooves 218 that extend above the cooling channels 214, 216 towards the puck 202. The grooves 218 collectively have a larger surface area than the channels 214, 216 would otherwise have without the grooves 218. The increased surface area may increase the heat transfer rate and thus increase the responsiveness of the assembly 200 to the cooling fluid. The grooves 218 of the inner cooling channels 214 may have the same height as shown by arrows "A" and width as shown by arrows "B" as the height as shown by arrows "C" and width as shown by arrows "D" of the outer cooling channels 216. The grooves 218 may have a smaller width than the cooling channels 214, 216. Additionally, the number of grooves 218 present on the inner cooling channels 214 may be equal to the number of grooves on the outer cooling channels 216. In one embodiment, the height "A", "C" of the grooves 218 may be different. In another embodiment, the width "B", "D" of the grooves 218 may be different. The grooves 218 permit the cooling fluid to reach closer to the puck 202 and hence may provide better heat transfer between the base 206 and the puck 202.

Heat transfer between the puck 202 and the substrate (not shown) may be controlled by introducing a heat transfer gas between the substrate and the puck 202. The heat transfer gas may be introduced from a gas source 208 to the inner zone 224 and the outer zone 226 of the puck 202. In one embodiment, a separate gas source 208 may be present for each of the inner zone 224 and the outer zone 226. In another embodiment, a different heat transfer gas may be used for the inner zone 224 and the outer zone 226. Valves 230 may control the amount of heat transfer gas that may be introduced to the puck 202. Sealing bands 222 may define the border between the inner zone 224 and the outer zone 226 and reduce the amount of heat transfer gas that may move between the inner and outer zones 224, 226. The sealing bands 222 may also prevent the heat transfer gas from entering the processing area or escaping from behind the substrate.

One or more mesas 220 may be present on the surface of the puck 202 upon which the substrate may rest during processing. The mesas 220 may comprise cylindrical mounds, posts, pyramids, cones, rectangular blocks, bumps of varying sizes, or combinations thereof that extend up from the puck 202. In one embodiment, the height of the mesas 220 may be from about 10 microns to about 50 microns, and the width (or diameter) of the mesas 220 from about 500 microns to about 5000 microns. In one embodiment, the mesas 220 may be formed by bead blasting the puck 202 with a bead size that is suitably small, for example, in the tens of microns, to etch away by erosion the material of the puck 202 to form the shaped mesas 220.

Figure 3:
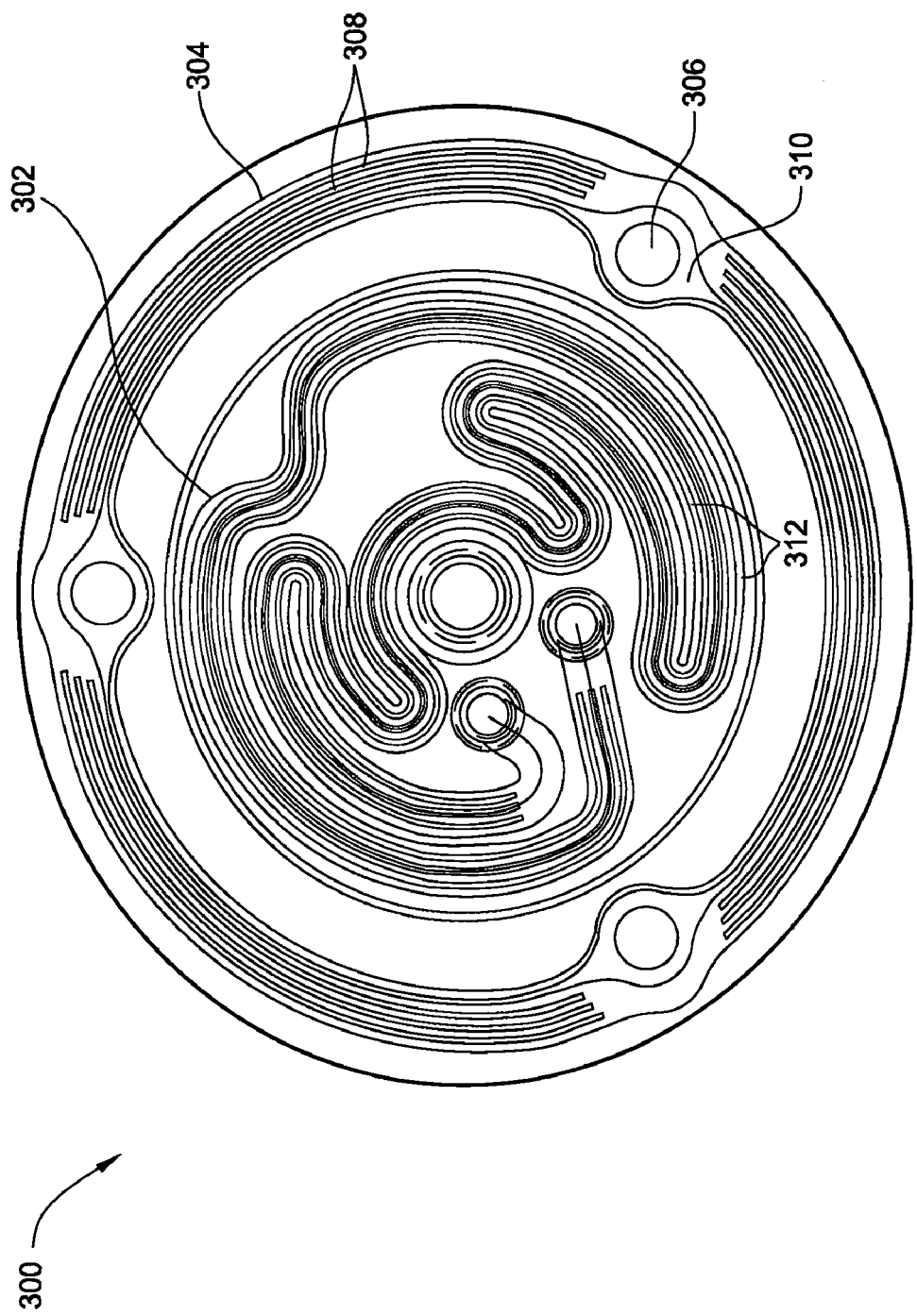
FIG. 3 is a schematic view of a cooling pattern for a base portion 300 of an electrostatic chuck assembly according to one embodiment of the invention.

FIG. 3 is a schematic view of a cooling pattern for a base portion 300 of an electrostatic chuck assembly according to one embodiment of the invention. The base portion 300 includes an inner cooling zone 302 and an outer cooling zone 304. A plurality of grooves 308 may be present in the outer cooling zone 304. One groove 310 may split in two and encircle a lift pin opening 306. After the lift pin opening 306, the groove 310 may be rejoined. The inner cooling channel 302 also has one or more grooves 312. As shown in FIG. 3, the inner cooling channel 302 may turn back on itself a plurality of times. In one embodiment, the inner cooling channel 302 may turn back upon itself nine times. In another embodiment, the inner cooling channel 302 may turn back on itself five times. The outer cooling channel 304, on the other hand, may substantially encircle the inner cooling channel 302. The outer cooling channel 304 may encompass one or more lift pin openings 306.

Figure 4:
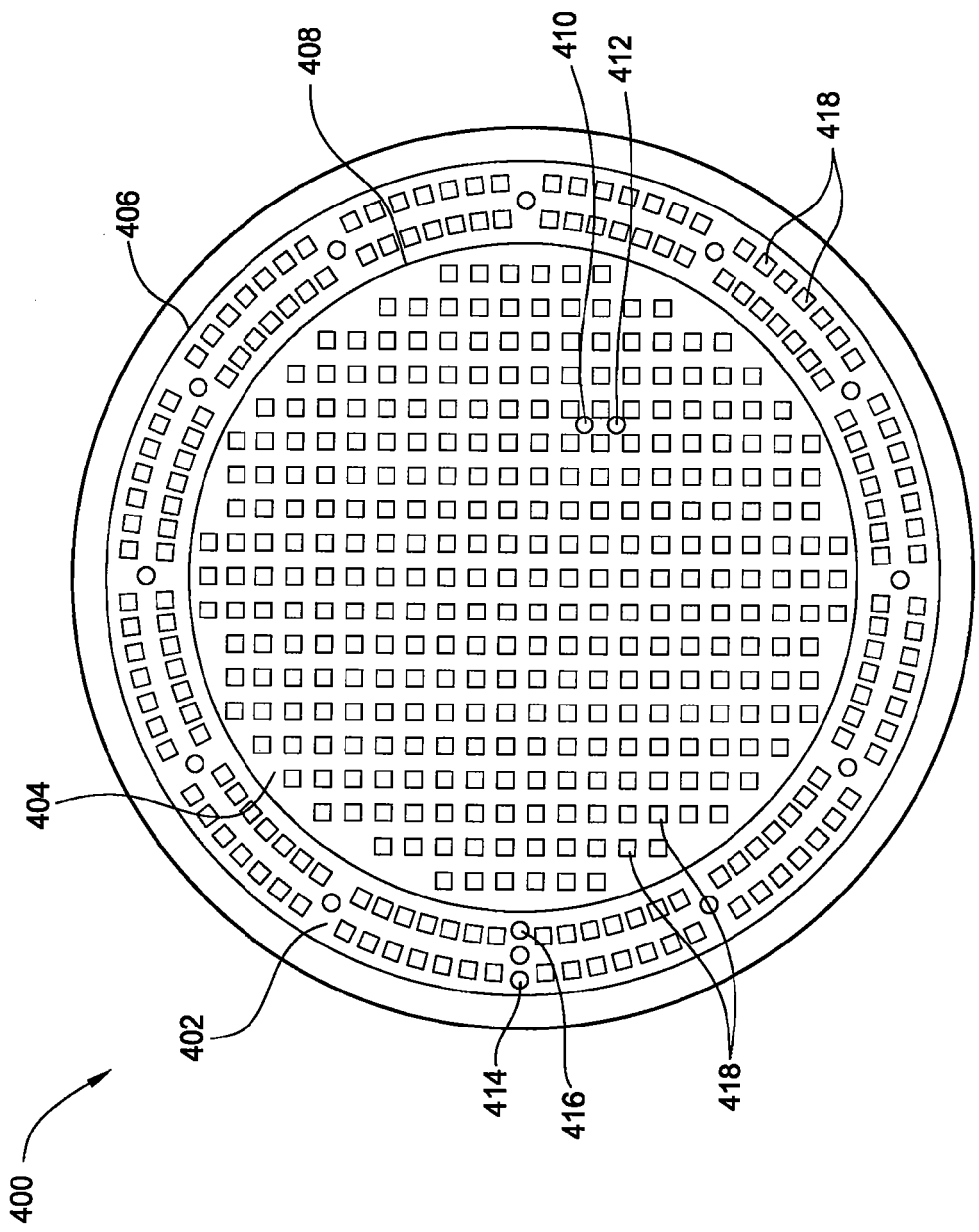
FIG. 4 is a schematic top view of a puck 400 for an electrostatic chuck assembly according to one embodiment of the invention.

FIG. 4 is a schematic top view of a puck 400 for an electrostatic chuck assembly according to one embodiment of the invention. The puck 400 may be divided into an inner zone 404 and an outer zone 402. The inner zone 404 may be isolated from the outer zone 402 by an inner sealing band 408. The outer zone 402 may be isolated from the chamber processing area by an outer sealing band 406. Heat transfer gas inlets 410, 414 and heat transfer gas outlets 412, 416 may be present to introduce and remove heat transfer gas from the inner zone 404 and the outer zone 402. Mesas 418 may be present in the inner zone 404 and the outer zone 402 to contact the back surface of a substrate while permitting a heat transfer gas to flow in the area between the puck 400 and the substrate. In one embodiment, the mesas 418 in the outer zone 402 may be arranged in a different pattern than the mesas 418 in the inner zone 404. The mesas 418 in the outer zone 402 may be arranged in a pattern having one or more rows of mesas 418 which encircle the inner zone 404. The mesas 418 of the inner zone 404 may be arranged in a substantially linear arrangement across the face of the puck 400. The different patterns within the inner zone 404 and the outer zone 402 may alter the flow of the heat transfer gas behind the substrate and hence, affect the temperature of the substrate. The patterns for the inner zone 404 and the outer zone 402 may be predetermined to optimize the heat transfer rate for the inner zone 404 and the outer zone 402. Additionally, the shapes of the mesas 418 may be predetermined to control the flow of the heat transfer gas behind the substrate. Different combinations of shapes of the mesas 418 may change the heat transfer rate and thus may be desirable. The shapes and pattern of the mesas 418 may be different within each of the zones 402, 404. In one embodiment, the area corresponding to the center of the inner zone 404 may have a different pattern and/or mesa 418 shape compared to the area corresponding to the edge of the inner zone 404.

Having grooves extending from cooling channels within a base portion of an electrostatic chuck assembly may permit greater control over heat transfer rates from the assembly to the substrate. Additionally, different patterns on the puck may alter the gas flow behind the substrate and hence, change the heat transfer rate to the substrate. By predetermining the pattern of mesas on the puck and the grooves in the base, the heat transfer rate for the electrostatic chuck assembly may be optimized to the particular needs of the process.

While the foregoing is directed to embodiments of the present invention, other and further embodiments of the invention may be devised without departing from the basic scope thereof, and the scope thereof is determined by the claims that follow.

The invention claimed is:

1. An electrostatic chuck base, comprising:
an electrostatic chuck base body having an inner cooling channel and an outer cooling channel formed within the body, wherein the outer cooling channel is substantially encircling the inner cooling channel, and one or more first grooves are coupled with and extending from the inner cooling channel, and one or more second grooves are coupled with and extending from the outer cooling channel.

2. The electrostatic chuck base of claim 1, wherein the inner cooling channel is arranged in a first pattern and the outer cooling channel is arranged in a second pattern different from the first pattern.

3. The electrostatic chuck base of claim 1, wherein the inner cooling channel winds through the base and turns back upon itself a plurality of times.

4. The electrostatic chuck base of claim 3, wherein the inner cooling channel turns back upon itself about five or more times.

5. The electrostatic chuck base of claim 1, wherein a width of the one or more first grooves is substantially equal to a width of the one or more second grooves.

6. The electrostatic chuck base of claim 1, wherein a height of the one or more first grooves is substantially equal to a height of the one or more second grooves.

7. The electrostatic chuck base of claim 1, wherein at least one groove of the plurality of grooves has a varying width.

8. The electrostatic chuck base of claim 7, wherein the at least one groove having a varying width splits and encircles a lift pin opening.

9. A puck for an electrostatic chuck assembly, comprising:
a puck body; and
a plurality of mesas arranged across the puck body in at least two different patterns, wherein the at least two different patterns comprise at least a first inner pattern in a substantially linear arrangement across a face of the puck and at least a second outer pattern having one or more rows encircling the first inner pattern.

10. The puck of claim 9, wherein the puck body has a first surface adapted to receive a substrate, the first surface having an inner zone and an outer zone encircling the inner zone, wherein
the first inner pattern comprises a first plurality of mesas disposed in a substantially linear arrangement on the first surface in the inner zone and extending above the first surface; and
the second outer pattern comprising a second plurality of mesas disposed on the first surface in the outer zone and extending above the first surface, the second plurality of mesas arranged in one or more rows encircling the first inner pattern.

11. The puck of claim 10, wherein the inner zone and the outer zone each comprise a heat exchanging gas inlet.

12. An electrostatic chuck assembly, comprising:
a puck, the puck comprising:
a puck body; and
a plurality of mesas arranged across the puck body in at least two different patterns, wherein the at least two different patterns comprise at least a first inner pattern in a substantially linear arrangement across a face of the puck and at least a second outer pattern having one or more rows encircling the first inner pattern; and an electrostatic chuck base body disposed adjacent the puck, the electrostatic chuck base body having an inner cooling channel and an outer cooling channel formed within the body, wherein the outer cooling channel is substantially encircling the inner cooling channel, and one or more first grooves are coupled with and extending from the inner cooling channel, and one or more second grooves are coupled with and extending from the outer cooling channel.

13. The electrostatic chuck assembly of claim 12, wherein the inner cooling channel is arranged in a first pattern and the outer cooling channel is arranged in a second pattern different from the first pattern.

14. The electrostatic chuck assembly of claim 12, wherein the inner cooling channel winds through the base and turns back upon itself a plurality of times.

15. The electrostatic chuck assembly of claim 14, wherein the inner cooling channel turns back upon itself about five or more times.

16. The electrostatic chuck assembly of claim 12, wherein a width of the one or more first grooves is substantially equal to a width of the one or more second grooves.

17. The electrostatic chuck assembly of claim 12, wherein a height of the one or more first grooves is substantially equal to a height of the one or more second grooves.

18. The electrostatic chuck assembly of claim 12, wherein at least one groove of the plurality of grooves has a varying width.

19. The electrostatic chuck assembly of claim 18, wherein the at least one groove having a varying width splits and encircles a lift pin opening.

* * * * *